United States Patent
Maejima

(10) Patent No.: US 8,625,329 B2
(45) Date of Patent: Jan. 7, 2014

(54) SEMICONDUCTOR STORAGE DEVICE INCLUDING VARIABLE RESISTIVE ELEMENTS

(75) Inventor: Hiroshi Maejima, Tokyo (JP)

(73) Assignee: Kabushiki Kaisha, Toshiba (JP)

( * ) Notice: Subject to any disclaimer, the term of this patent is extended or adjusted under 35 U.S.C. 154(b) by 314 days.

(21) Appl. No.: 13/187,891

(22) Filed: Jul. 21, 2011

(65) Prior Publication Data

US 2012/0026778 A1 Feb. 2, 2012

(30) Foreign Application Priority Data

Jul. 28, 2010 (JP) ................................. 2010-168809

(51) Int. Cl.
*G11C 11/00* (2006.01)
(52) U.S. Cl.
USPC ........... 365/148; 365/158; 365/163; 365/171; 365/173
(58) Field of Classification Search
USPC .................. 365/148, 158, 161, 163, 171, 173
See application file for complete search history.

(56) References Cited

U.S. PATENT DOCUMENTS

| | | | |
|---|---|---|---|
| 2005/0122768 A1* | 6/2005 | Fukumoto | 365/158 |
| 2006/0203541 A1* | 9/2006 | Toda | 365/163 |
| 2010/0169740 A1* | 7/2010 | Jagasivamani et al. | 714/763 |
| 2010/0232208 A1 | 9/2010 | Maejima et al. | |
| 2011/0085370 A1* | 4/2011 | Chen et al. | 365/148 |
| 2013/0163338 A1 | 6/2013 | Kato | |

FOREIGN PATENT DOCUMENTS

JP 2008-227267 9/2008

* cited by examiner

*Primary Examiner* — Thao Bui
(74) *Attorney, Agent, or Firm* — Oblon, Spivak, McClelland, Maier & Neustadt, L.L.P.

(57) ABSTRACT

A semiconductor memory device includes: a memory cell array including multiple first lines, multiple second lines crossing the first lines, and memory cells arranged at intersections between the first lines and the second lines and including variable resistive elements; and a control circuit which controls resistance values of the variable resistive elements in a way that a cell voltage is applied to the memory cell arranged at an intersection between a selected first line and a selected second line by applying first and second voltages to the selected first and second lines, respectively. The control circuit applies a voltage gradually raised or lowered from a first initial voltage as the first voltage to the selected first line, and a pulsing voltage as the second voltage to the selected second line.

15 Claims, 16 Drawing Sheets

MAIN Row decoder

X=<255:0>

Row Driver

WDRV Driver

VSSROW Switch

Column decoder
y=<127:0>

Column Driver

VWR Generator

VUX Generator

VUB Generator

ND VARIABLE RESISTIVE
SEMICONDUCTOR STORAGE DEVICE INCLUDING VARIABLE RESISTIVE ELEMENTS

CROSS-REFERENCE TO RELATED APPLICATIONS

This application is based upon and claims the benefit of priority from the prior Japanese Patent Application No. 2010-168809, filed Jul. 28, 2011, the entire contents of which are incorporated herein by reference.

BACKGROUND OF THE INVENTION

1. Field of the Invention

The present invention relates to a semiconductor storage device capable of appropriate set and forming operations.

2. Description of the Related Art

In recent years, a resistance change memory device using variable resistive elements as storage elements has attracted attention as a possible successor to a flash memory. The resistance change memory device is, for example, a resistive RAM (ReRAM). The resistance change memory mentioned herein includes a resistance change memory in a narrow sense which is configured to store the resistance state of a recording layer made of a transition metal oxide in a non-volatile manner. For example, the resistance change memory includes a phase change RAM (PCRAM) memory or the like which includes a recording layer made of chalcogenide or the like and utilizes resistance information of the recording layer in a crystalline state (serving as a conductor) and a non-crystalline state (serving as an insulator).

The resistance change memory stores data therein by turning variable resistive elements into a low resistance state by a set operation and into a high resistance state by a reset operation. In a resistance change memory immediately after being manufactured, the variable resistive elements have very high resistance values, which are not easily changed. Hence, a forming operation is executed by applying a high voltage to the variable resistive elements. The forming operation can make the resistance values of the variable resistive elements changeable between the high resistance state and the low resistance state. As a result, the variable resistive elements become ready to operate as memory cells.

However, resistance values of a conventional resistance change memory vary largely among multiple variable resistive elements after the set operation or the forming operation. Having a large variation, the variable resistive elements have difficulty in various subsequent operations (for example, see Japanese Patent Application Publication (Kokai) No. 2008-227267).

BRIEF SUMMARY OF THE INVENTION

A semiconductor memory device according to an aspect includes: a memory cell array including a plurality of first lines, a plurality of second lines crossing the first lines, and memory cells arranged at intersections between the first lines and the second lines and each including a variable resistive element; and a control circuit which controls resistance values of the variable resistive elements in such a way that a cell voltage is applied to the memory cell arranged at an intersection between a selected one of the plurality of first lines and a selected one of the plurality of second lines by applying a first voltage to the selected first line and by applying a second voltage to the selected second line, wherein the control circuit applies a voltage gradually raised or lowered from a first initial voltage as the first voltage to the selected first line, and applies a pulsing voltage as the second voltage to the selected second line, and the second voltage includes a voltage pulse which is raised from a second initial voltage which the memory cell is a non-selected state to a raised voltage which the memory cell is a selected state, is kept at the raised voltage to thereby cause a cell current to flow into the memory cell, and is lowered to the second initial voltage when the cell current that increases while the voltage of the memory cell is rising with a change in the first voltage reaches a compliance current.

DETAILED DESCRIPTION OF THE INVENTION

Hereinbelow, a description is given of a semiconductor storage device according to embodiments with reference to the drawings.

First Embodiment

[Configuration]

Figure 1:
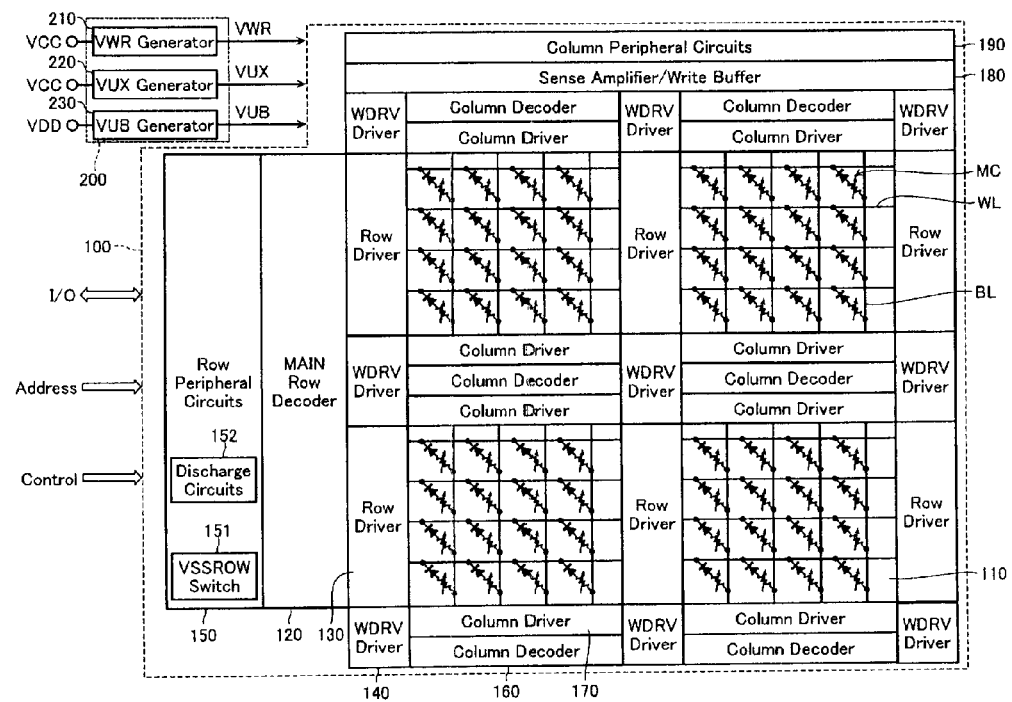
FIG. 1 is a block diagram of a semiconductor storage device (a non-volatile memory) according to a first embodiment.

FIG. 1 is a block diagram of a semiconductor storage device (a non-volatile memory) according to a first embodiment. The semiconductor storage device according to the embodiment includes a memory cell array core portion 100 surrounded by a dotted line in FIG. 1 and power circuits 200 configured to generate and supply a voltage to be used for the memory cell array core portion 100.

The memory cell array core portion 100 includes memory cell arrays 110, row control circuits, and column control circuits. Each of the memory cell arrays 110 includes multiple word lines WL extending in a row direction, multiple bit lines BL extending in a column direction which crosses the word lines WL, multiple memory cells MC provided at intersections between word lines WL and bit lines BL. The word lines WL are divided into multiple groups each including a predetermined number of word lines WL based on main word lines. Likewise, the bit lines BL are divided into multiple groups each including a predetermined number of bit lines BL based on column selection lines.

The row control circuits and the column control circuits in the memory cell array core portions 100 select a predetermined one of the memory cells MC in the memory cell array 110 based on an address signal (Address) and a control signal (Control) supplied from outside and performs a set/reset, read, or forming operation.

The row control circuits include a main row decoder 120, row drivers 130, write-drive-line (WDRV) drivers 140, and row peripheral circuits 150. The main row decoder 120 selects a one of the main word lines based on an address signal. Row drivers 130 are provided for respective main word lines. Each row driver 130 supplies a voltage for the set operation or the like to the predetermined number of the word lines WL belonging to the corresponding main word line according to a selected/non-selected state of the main word line. Based on the address signal, each of the write-drive-line drivers 140 prepares a voltage to be supplied to the word lines WL by the row driver 130. The row peripheral circuits 150 include other row circuits. The row peripheral circuits 150 include a VSSROW switch 151 and discharge circuits 152. The VSSROW switch 151 selects whether a voltage VSS-ROW to be applied to each word line WL is set at a fixed value VSS or a voltage REG_VSSROW which changes in a sloping manner. The discharge circuits 152 generate the voltage REG_VSSROW to be supplied to the word line WL.

In contrast, the column control circuits include column decoders 160, column drivers 170, a sense amplifier/write buffer 180, and column peripheral circuits 190. Each of the column decoder 160 selects a predetermined one of the column selection lines based on the address signal. The column drivers 170 are provided for respective column selection lines. Each column driver 170 inputs and outputs data to and from the predetermined number of bit lines BL belonging to the corresponding column selection line according to a selected/non-selected state of the column selection line. The sense amplifier/write buffer 180 outputs the data inputted thereto with a data input/output signal (I/O), to the column driver 170. The sense amplifier/write buffer 180 also transmits data received from the column driver 170 and appearing on the bit line BL, to the outside as a data input/output signal. The column peripheral circuits 190 include a regulator 50 to be described later and other necessary column circuits.

The power circuits 200 include a selected-bit-line voltage generator 210, a non-selected-word-line voltage generator 220, and a non-selected-bit-line voltage generator 230. The selected-bit-line voltage generator 210 raises an external supply voltage VCC to generate a selected-bit-line voltage VWR. The non-selected-word-line voltage generator 220 adjusts the external supply voltage VCC to generate a non-selected-word-line voltage VUX. The non-selected-bit-line voltage generator 230 adjusts a supply voltage VDD to generate a non-selected-bit-line voltage VUB. The details of the selected-bit-line voltage VWR, the non-selected-word-line voltage VUX, and the non-selected-bit-line voltage VUB will be described later.

Figure 2:
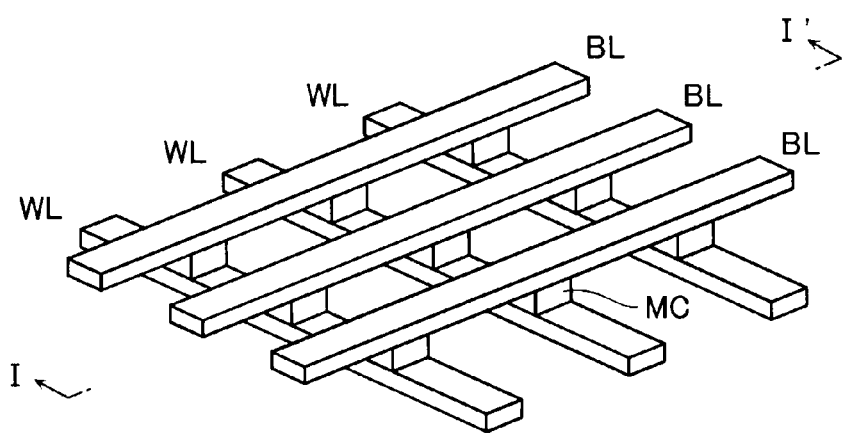
FIG. 2 is a perspective view of a part of a memory cell array of the semiconductor storage device according to the first embodiment.
Figure 3:
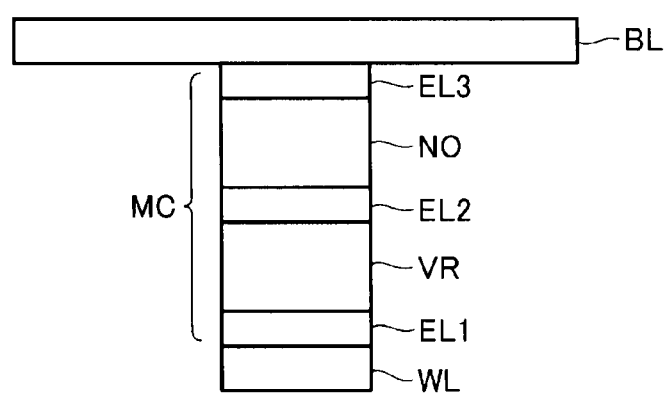
FIG. 3 is a cross-sectional diagram of a single memory cell taken along the I-I' line in FIG. 2 and viewed in an arrow direction.

FIG. 2 is perspective view of a part of the memory cell array 110. FIG. 3 is a cross-sectional diagram of a single memory cell taken along the I-I' line in FIG. 2 and viewed in an arrow direction.

As shown in FIG. 2, in the memory cell array 110, multiple word lines WL0 to WL2 are arranged in parallel to each other, multiple bit lines BL0 to BL2 which cross the word lines WL0 to WL2 are arranged in parallel to each other, and the memory cells MC are arranged at intersections between the bit lines BL0 to BL2 and the word lines WL0 to WL2 in such a manner as to be located therebetween. The word lines WL and the bit lines BL are preferably made of a material which is heat resistant and has a low resistance value. For example, W, WSi, NiSi, CoSi or the like may be used.

As shown in FIG. 3, each memory cell MC is formed of a serial circuit including a variable resistive element VR and a non-ohmic element NO.

The variable resistive element VR varies a resistance value through a current, heat, chemical energy or the like when a voltage is applied. The variable resistive element VR is located between electrodes EL1 and EL2 each serving as a barrier metal and bonding layer. The electrodes EL1 and EL2 are formed of Pt, Au, Ag, TiAlN, SrRuO, Ru, RuN, Ir, Co, Ti, TiN, TaN, LaNiO, Al, PtIrOx, PtRhOx, Rh/TaAlN or the like.

The variable resistive element VR is formed by any one of a PCRAM, a CBRAM, and a ReRAM. The PCRAM, like chalcogenide or the like, varies the resistance value by phase transition between a crystalline state and a non-crystalline state. The CBRAM varies the resistance value by forming a conducting bridge between electrodes due to metal cation deposition, or by destroying the conducting bridge due to ionization of a deposited metal. The ReRAM varies the resistance value by applying a voltage or a current. In addition, the ReRAM is roughly categorized into two: one in which the resistance is changed depending on the presence of charges trapped by a charge trap existing in an interface of an electrode; and the other in which the resistance is changed depending on the presence of a conduction path caused by oxygen deficiency or the like.

Figure 4:
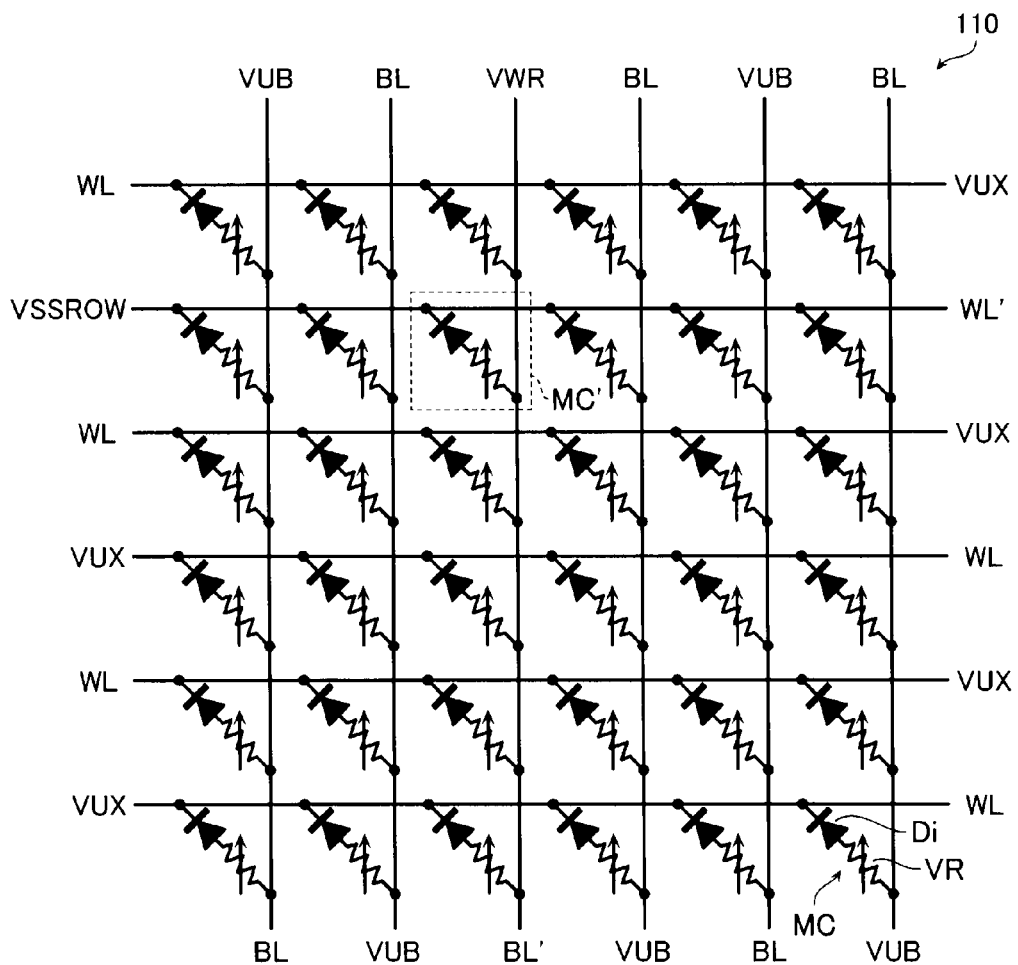
FIG. 4 is a diagram showing a biased state of the memory cell array at the time of a set/reset operation in the first embodiment.
Figure 5:
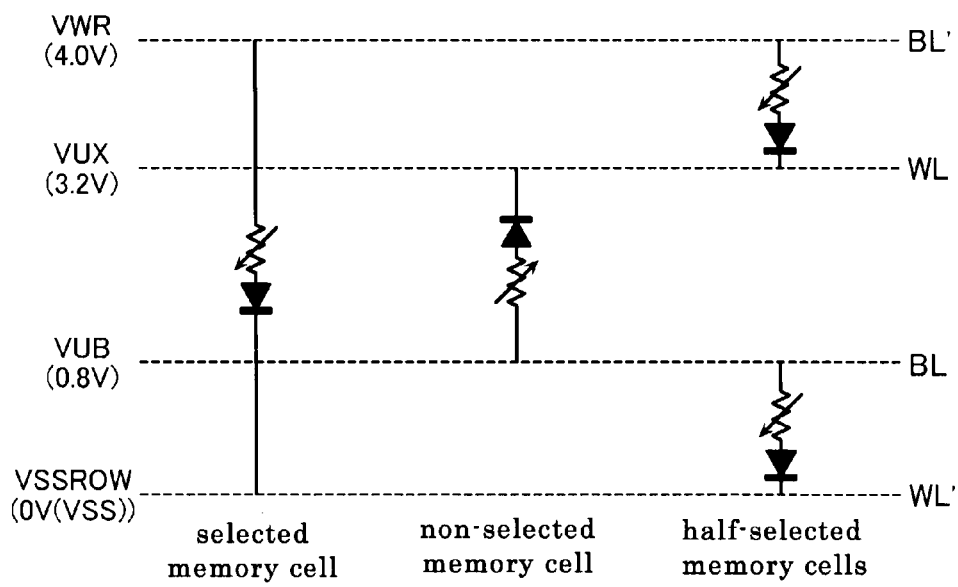
FIG. 5 is a diagram showing the biased state of the memory cell array at the time of the set/reset operation in the first embodiment.

FIGS. 4 and 5 are diagrams showing a biased state in the memory cell array 110 according to this embodiment at the time of set/reset operation. A description is herein given by taking as an example a case where the set/reset operation is performed on the memory cell MC' surrounded by a dotted line in FIG. 4.

As shown in FIG. 4, the selected-bit-line voltage VWR is applied to a bit line (hereinafter, referred to as a "selected bit line") BL' connected to the selected memory cell MC'. The non-selected-word-line voltage VUX is applied to word lines (hereinafter, referred to as "non-selected word lines") WL not connected to the selected memory cell MC'. The non-selected-bit-line voltage VUB is applied to bit lines (hereinafter, referred to as "non-selected bit lines") BL not connected to the selected memory cell MC'. The selected-word-line voltage VSSROW is applied to a word line (hereinafter, referred to as a "selected word line") WL' connected to the selected memory cell MC'.

Note that the selected-bit-line voltage VWR is, for example, 4.0 V higher than the selected-word-line voltage VSSROW. Thereby, a write voltage is applied to the selected memory cell MC' in a forward direction of a diode Di as shown in FIG. 5, and thus the set/reset operation is performed. The non-selected-word-line voltage VUX is higher than the non-selected-bit-line voltage VUB. Thereby, a voltage "VUX−VUB" is applied to memory cells MC connected to the non-selected word lines WL and the non-selected bit lines BL (hereinafter, referred to as a "non-selected memory cell"), in a reverse direction of a corresponding diode Di as shown in FIG. 5, and thus the set/reset operation is not performed. The non-selected-word-line voltage VUX is lower than the selected-bit-line voltage VWR, and the difference therebetween is at least a forward voltage VF (for example, 0.8 V) of the diode Di of each memory cell MC. Likewise, the non-selected-bit line voltage VUB is higher than the selected-word-line voltage VSSROW, and the difference therebetween is at least the forward voltage VF of the diode Di of the memory cell MC. Thereby, as shown in FIG. 5, a bias voltage exceeding the forward voltage VF is, in the forward direction of the diode Di, not applied to the memory cells MC (hereinafter, referred to as "half-selected memory cells"): connected to the non-selected word lines WL and the selected bit line BL'; and connected to the selected word line WL' and the non-selected bit lines BL. Thus, the set/reset operation is not performed. The selected-word-line voltage VSSROW is a ground voltage VSS.

Hereinbelow, a description is given of the row control circuits, the column control circuits, and the power circuits 200 all of which implement such a bias relationship as shown in FIGS. 4 and 5. The description is given by taking as an example a case where the memory cell array 110 is formed by memory cells MC having 2K bits (2048 bits) in a word line direction and 512 bits in a bit line direction.

A specific configuration of the row control circuits will be described.

Figure 6:
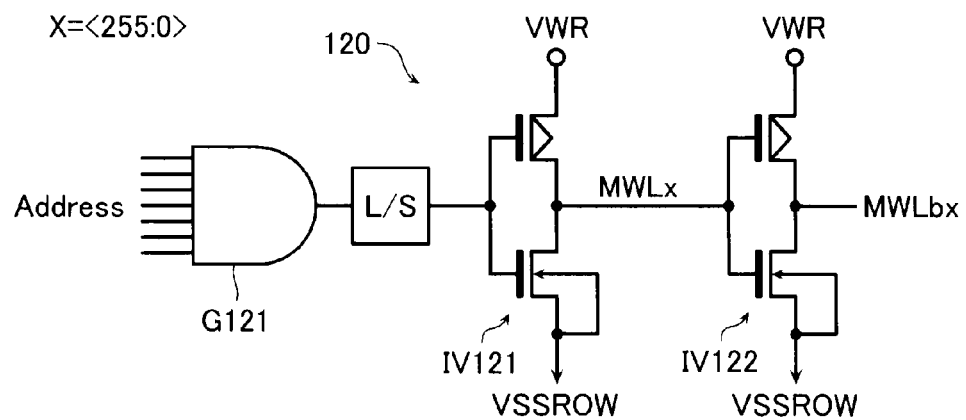
FIG. 6 is a circuit diagram of a main row decoder 120 in the first embodiment.

FIG. 6 is a circuit diagram of the main row decoder 120. The main row decoder 120 is a predecoder. The main row decoder 120 inputs a row address and selects one pair of 256 pairs of main word lines MWLx (x=<255:0>) and MWLbx. Note that the main row decoder 120 includes a circuit shown in FIG. 6 for each pair of the 256 pairs of the main word lines MWLx and MWLbx. As shown in FIG. 6, the main row decoder 120 includes a NAND gate G121, a level shifter L/S, an inverter IV121, and an inverter IV122. The NAND gate G121 receives an address signal (Address). The level shifter L/S shifts the level of output from the NAND gate G121. The inverter IV121 receives the output from the level shifter L/S. The inverter IV122 receives the output from the inverter IV121. Note that the outputs of the inverters IV121 and IV122 are connected to the corresponding main word lines MWLx and MWLbx, respectively.

The main row decoder 120 selects x based on the address signal (Address) to supply the voltages VWR and VSSROW to the main word lines MWLx and MWLbx, respectively.

Subsequently, a description is given of the row drivers 130.

Figure 7:
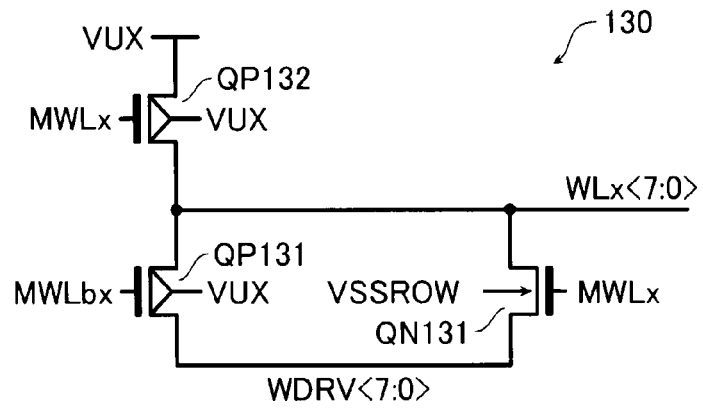
FIG. 7 is a circuit diagram of a row driver 130 in the first embodiment.

FIG. 7 is a circuit diagram of each row driver 130. The row driver 130 receives one pair of the 256 pairs of the main word lines MWLx (x=<255:0>) and MWLbx. The row drivers 130 of which number is eight are provided per main row decoder 120. Each row driver 130 includes: two transistors QP131 and QN131 which are provided between write drive lines WDRV <7:0> and the word lines WLx <7:0> and are respectively controlled by the main word lines MWLbx and MWLx; and a transistor QP132 which is provided between the power line of the non-selected-word-line voltage VUX and the word lines WLx <7:0> and is controlled by the main word line MWLx.

The row driver 130 connects the word lines WLx <7:0> with either the write drive lines WDRV <7:0> or the power lines of the non-selected-word-line voltage VUX, depending on the selected/non-selected state of the main word line MWLx. Thereby, the word lines WLx <7:0> are supplied with either the selected-word-line voltage VSSROW or the non-selected-word-line voltage VUX.

Next, a description is given of the write-drive-line driver 140.

Figure 8:
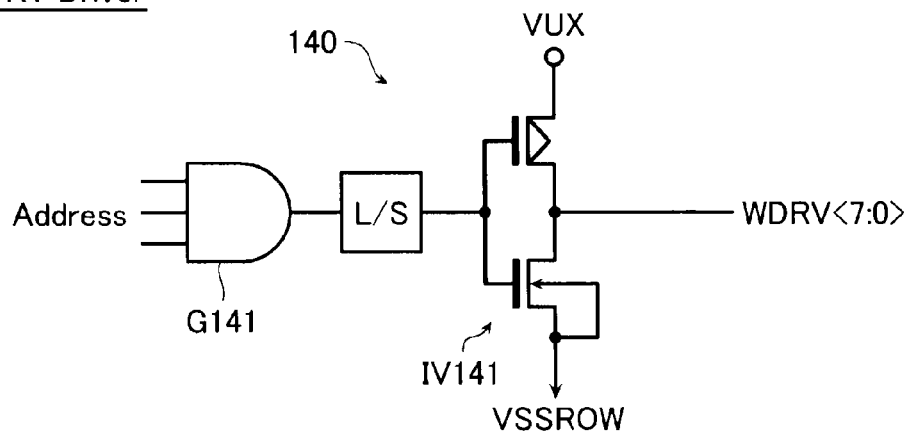
FIG. 8 is a circuit diagram of a write-drive-line driver 140 in the first embodiment.

FIG. 8 is a circuit diagram of the write-drive-line driver 140. The write-drive-line driver 140 is a predecoder. The write-drive-line driver 140 includes a NAND gate G141, a level shifter L/S, and an inverter IV141. The NAND gate G141 receives an address signal (Address). The level shifter L/S shifts the level of output from the NAND gate G141. The inverter IV141 receives the output from the level shifter L/S. The inverter IV141 is provided between a terminal for the non-selected-word-line voltage VUX and a terminal for the selected-word-line voltage VSSROW, and output therefrom is connected to the corresponding write drive line WDRV.

The write-drive-line driver 140 supplies the write drive lines WDRV <127:0> corresponding to the inputted address with the selected-word-line voltage VSSROW and supplies the other write drive lines WDRV <127:0> with the non-selected-word-line voltage VUX. The voltages for the write drive lines WDRV are supplied to the word lines WLx through the row driver 130.

According to the main row decoder 120, the row drivers 130, and the write-drive-line drivers 140 having the aforementioned configurations, only the word lines WLx selected based on the address signal are supplied with the selected-word-line voltage VSSROW, and the other word lines WL are supplied with the non-selected-word-line voltage VUX.

Next, a description is given of the VSSROW switch 151.

Conventionally, the voltage VSSROW has been set at the voltage VSS. However, this embodiment provides the VSSROW switch 151. Note that the sloping voltage REG_VSSROW to be newly generated is a voltage for slowly lowering a voltage to be applied to the word lines WL. In other words, the VSSROW switch 151 is a circuit for supplying the sloping voltage REG_VSSROW as the voltage VSSROW.

Figure 9:
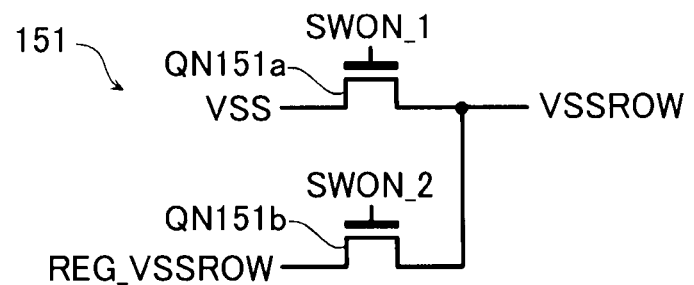
FIG. 9 is a circuit diagram of a VSSROW switch 151 in the first embodiment.

FIG. 9 is a circuit diagram of the VSSROW switch 151. The VSSROW switch 151 includes NMOS transistors QN151a and QN151b. The NMOS transistors QN151a and QN151b are supplied at gates thereof with signals SWON_1 and SWON_2, respectively, and each select and output, as the selected-word-line voltage VSSROW, either the ground voltage VSS or the sloping voltage REG_VSSROW on the basis of the corresponding signal.

Next, a description is given of the discharge circuits 152.

Figure 10:
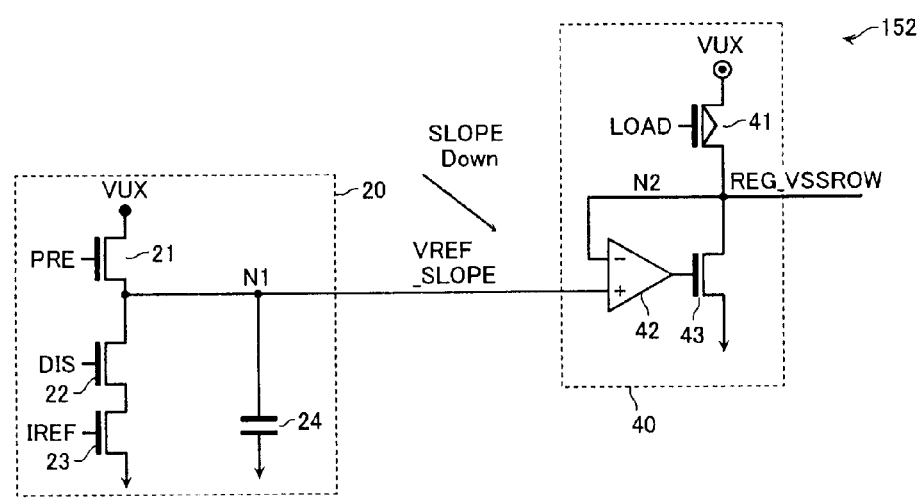
FIG. 10 is a circuit diagram of discharge circuits 152 in the first embodiment.

FIG. 10 is a circuit diagram of the discharge circuits 152. The discharge circuits 152 generate the sloping voltage REG_VSSROW to be applied to the word lines WL to drive the word lines WL. The discharge circuits 152 include a voltage generator 20 and a regulator 40. The voltage generator 20 generates a voltage VREF_SLOPE continuously lowering with the elapse of time during the forming, set or reset operation and supplies the voltage VREF_SLOPE to the regulator 40.

The voltage generator 20 includes: NMOS transistors 21, 22, and 23 which are serially connected to each other; and a capacitor 24 which is connected to a connection node N1 between the NMOS transistors 21 and 22. The NMOS transistor 21 receives the voltage VUX (about 5 V) applied to a drain thereof. When the gate receives a precharge signal PRE, the NMOS transistor 21 precharges the capacitor 24 connected to the node N1. When a gate of the NMOS transistor 22 receives a discharge signal DIS, the NMOS transistor 22 discharges charges in the capacitor 24. At this time, a gate signal IREF is supplied to a gate of the NMOS transistor 23, so that a constant current flows through a discharge path formed by the NMOS transistors 22 and 23. Based on a value of the discharge current, the rate of voltage drop of the output voltage VREF_SLOPE is determined.

Note that a configuration may be employed in which the capacitors 24 are connected in multiple so that the capacitance of the capacitors 24 can be changed depending on the number of the capacitors 24 turned on by an unillustrated switch. Alternatively, the dropping rate of the voltage VREF_SLOPE can also be changed by changing the voltage IREF.

The regulator 40 generates the voltage REG_VSSROW according to the voltage VREF_SLOPE outputted from the voltage generator 20. The regulator 40 is used so as to stably supply a voltage REG_VSSROW even in fluctuation of a value of the current flowing to the word lines WL. The regulator 40 includes: a PMOS transistor 41 and an NMOS transistor (final stage driver) 43 (only one of NMOS transistors 43 is illustrated in FIG. 10) which are serially connected to each other via an output node N2; and an operational amplifier 42 in which the voltage VREF_SLOPE is inputted to a non-inverting input terminal, an inverting input terminal is connected to the node N2, and an output terminal is connected to a gate of the NMOS transistor 43. The operational amplifier 42 receives the voltage VREF_SLOPE outputted from the voltage generator 20 at the non-inverting terminal thereof and controls the NMOS transistor 43 so that the voltage REG_VSSROW similar to the voltage VREF_SLOPE can be outputted to the node N2 to which the inverting input terminal is connected. The PMOS transistor 41 is supplied with the voltage VUX at a source thereof and is given a control signal LOAD at a gate thereof to control an output current flowing in the word lines WL. The NMOS transistor 43 functions as the final stage driver which drives the word lines WL.

Figure 11:
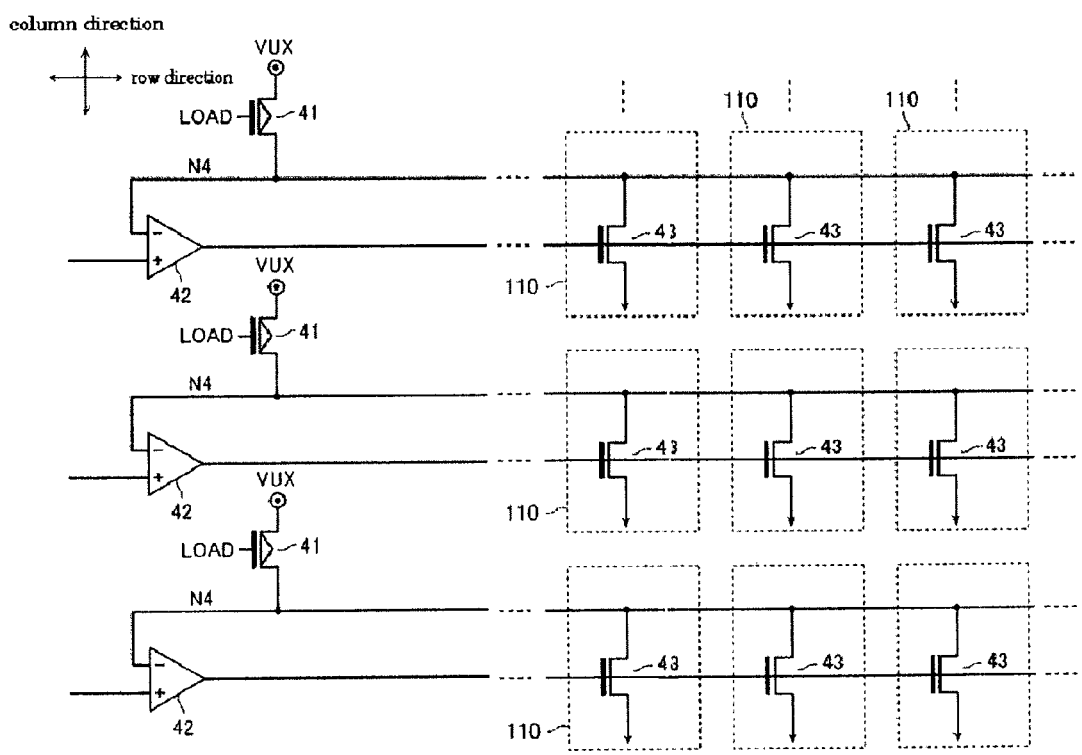
FIG. 11 is a diagram showing a specific arrangement of a regulator 40 in the first embodiment.

Next, a description is given of a specific configuration of the regulator 40 with reference to FIG. 11. The memory cell arrays 110 are arranged on a semiconductor substrate in the row and column directions in a matrix form. The PMOS transistor 41 and the operational amplifier 42 in the regulator 40 are each provided for the multiple memory cell arrays 110 arranged in the row direction. The NMOS transistors 43 in the regulator 40 are arranged on the semiconductor substrate below the memory cell arrays 110. The gates of the NMOS transistors 43 arranged in a line are connected commonly. The drains of the NMOS transistors 43 arranged in a line are also connected commonly. Such an arrangement can achieve a reduced occupied space in the first embodiment.

Next, a description is given of a specific configuration of the column control circuits. Firstly, a description is given of a regulator 50 for driving bit lines BL arranged in the column control circuits.

Figure 12:
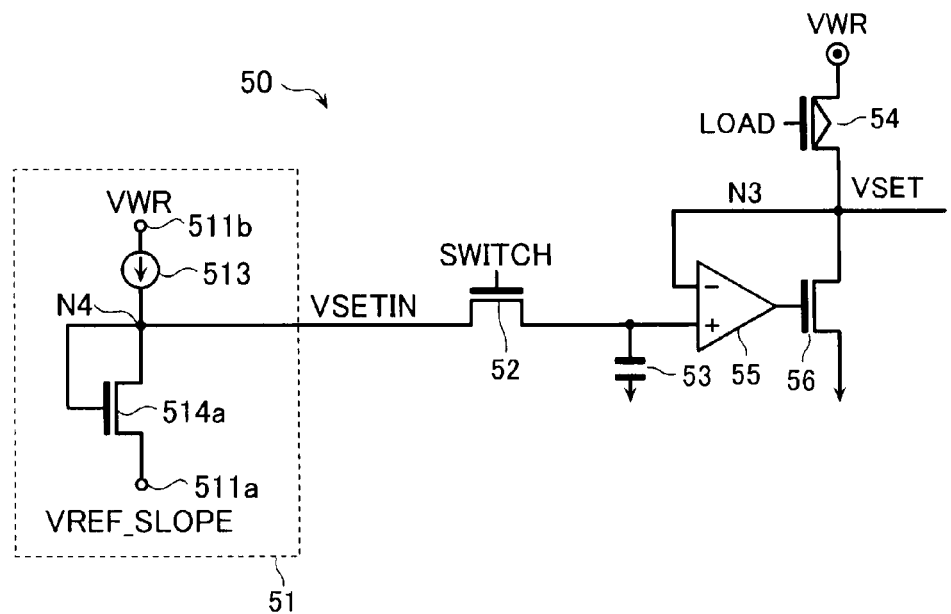
FIG. 12 is a circuit diagram of a regulator 50 in the first embodiment.

FIG. 12 is a circuit diagram showing the regulator 50. The regulator 50 outputs a pulsing voltage VSET to the bit lines BL based on the voltage VREF_SLOPE outputted from the voltage generator 20. The voltage of the pulsing voltage VSET at the rising edge is a predetermined value (Vα) higher than the voltage REG_VSSROW outputted from the regulator 40. It is preferable that the voltage Vα is set at a value approximately equal to, for example, a forward voltage Vf of the diode Di. The regulator 50 includes a level shifter 51, a switch 52, a capacitor 53, a PMOS transistor 54, an operational amplifier (differential amplifier) 55, and an NMOS transistor (final stage driver) 56.

The level shifter 51 is supplied with the voltages VREF_SLOPE and VWR from input terminals 511a and 511b, respectively. Based on the voltages, the level shifter 51 generates and outputs a voltage VSETIN which is the predetermined voltage (Vα) higher than the voltage VREF_SLOPE. The level shifter 51 may use a circuit in which a constant current is flown from a constant current source 513 to a diode-connected NMOS transistor 514a (or a resistor) to generate a shift voltage equivalent to a voltage drop (Vα) in the NMOS transistor 514a (or resistor). The output voltage VSETIN of the level shifter 51 is held in the capacitor 53 when the switch 52 is on.

A circuit of an output stage of the regulator 50 has the same configuration as that of the regulator 40. Specifically, the regulator 50 includes: a PMOS transistor 54 and an NMOS transistor (final stage driver) 56 which are serially connected to each other via an output node N3; and an operational amplifier 55 in which the voltage VSETIN is inputted to a non-inverting input terminal, an inverting input terminal is connected to the node N3, and an output terminal is connected to a gate of the NMOS transistor 56. The operational amplifier 55 receives the voltage VSETIN at the non-inverting terminal thereof and controls the NMOS transistor 56 so that the voltage VSET similar to the voltage VSETIN can be outputted to the node N3 to which the inverting input terminal is connected.

Next, a description is given of the column decoders 160.

Figure 13:
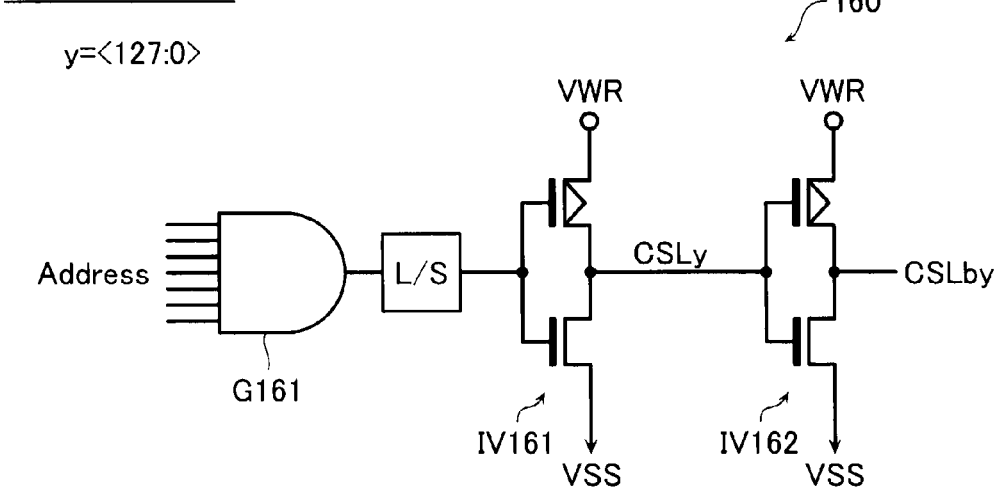
FIG. 13 is a circuit diagram of a column decoder 160 in the first embodiment.

FIG. 13 is a circuit diagram of each column decoder 160. The column decoder 160 receives a column address to select one pair of 128 pairs of a column selection line CSLy (y=<127:0>) and a column selection line CSLby. Note that the column decoder 160 includes a circuit shown in FIG. 13 for each pair of the 128 pairs of the column selection lines CSLy and CSLby. The column decoder 160 includes a NAND gate G161, a level shifter L/S, an inverter IV161, and an inverter IV162. The NAND gate G161 receives an address signal (Address). The level shifter L/S shifts the level of output from the NAND gate G161. The inverter IV161 receives the output from the level shifter L/S. The inverter IV162 receives the output from the inverter IV161. Note that the outputs of the inverters IV161 and IV162 are connected to the corresponding column selection lines CSLy and CSLby, respectively. The selected column selection lines CSLy and CSLby are supplied with the voltages VSS and VWR, respectively.

Next, a description is given of the column drivers 170.

Figure 14:
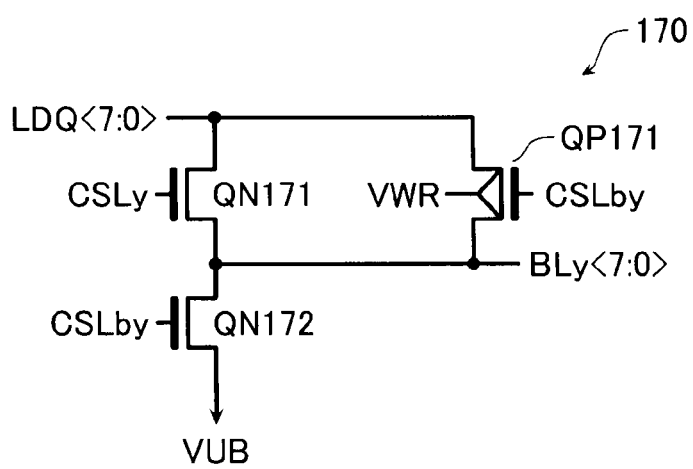
FIG. 14 is a circuit diagram of a column driver 170 in the first embodiment.

FIG. 14 is a circuit diagram of each column driver 170. The column driver 170 receives one pair of the 128 pairs of column selection lines CSLy (y=<127:0>) and CSLby. The column drivers 170 of which number is eight are provided per column decoder 160. Each column driver 170 includes: two transistors QN171 and QP171 which are provided between local data lines LDQ <7:0> and the bit lines BLy <7:0> and are respectively controlled by the column selection lines CSLy and CSLby; and a transistor QN172 which is provided between the power line of the non-selected-bit-line voltage VUB and the bit lines BLy <7:0> and is controlled by the column selection line CSLby.

The column driver 170 connects the bit line BLy with either the local data lines LDQ <7:0> or the power lines of the non-selected-bit-line voltage VUB, depending on the selected/non-selected state of the column selection line CSLy. Note that the voltage of the local data lines LDQ <7:0> is the voltage VSS for the selected-bit-line voltage VWR or the non-selected-bit-line voltage VUB which are supplied from the sense amplifier/write buffer 180. Thereby, the bit lines BLy <7:0> are supplied with either the selected-bit-line voltage VWR or the non-selected-bit-line voltage VUB.

Next, a description is given of the sense amplifier/write buffer 180.

Figure 15:
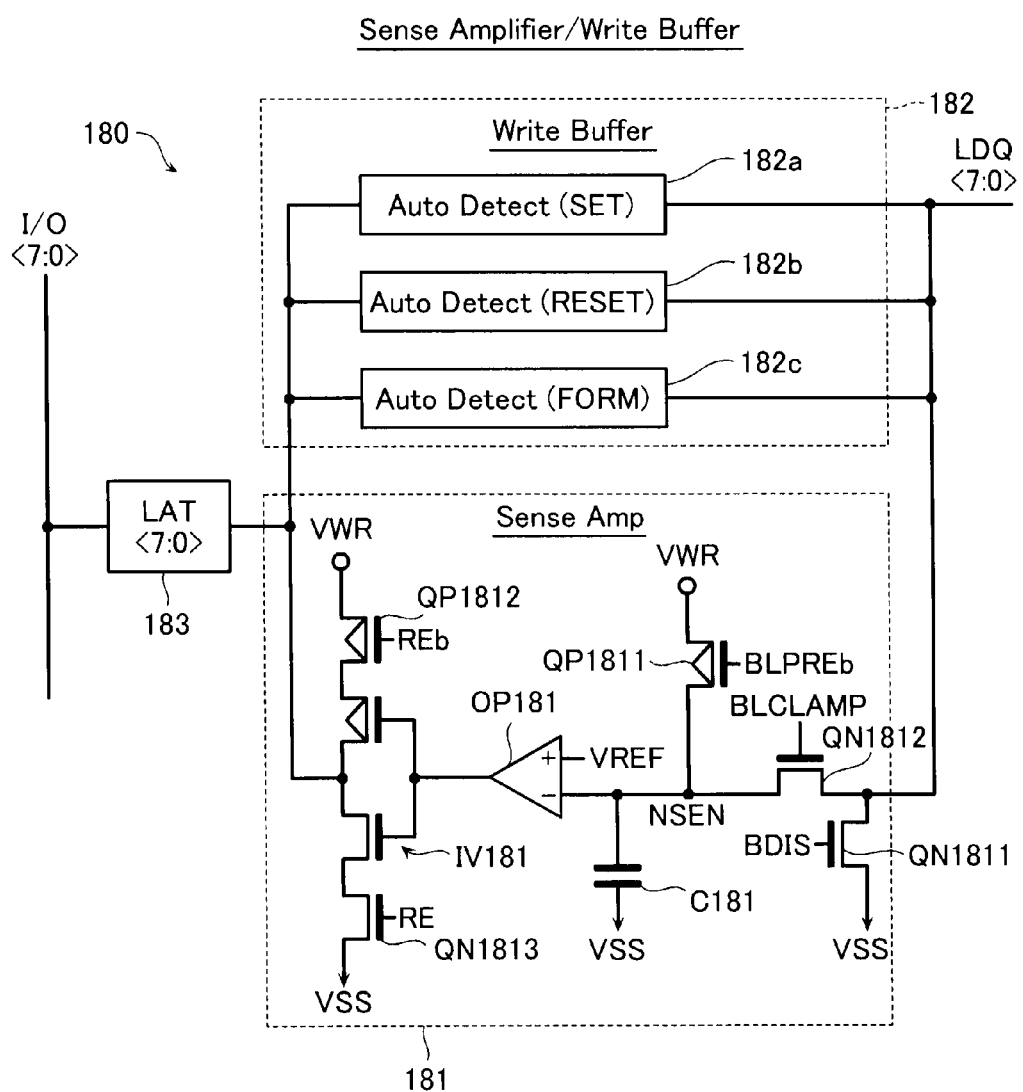
FIG. 15 is a circuit diagram of a sense amplifier/write buffer 180 in the first embodiment.

FIG. 15 is a circuit diagram of the sense amplifier/write buffer 180. The sense amplifier/write buffer 180 includes a sense amplifier 181, a write buffer 182, and a latch circuit 183.

The sense amplifier 181 is a circuit which detects and amplifies data of the memory cell MC appearing in the corresponding local data line LDQ <7:0> to transmit the data to the outside through a latch circuit LAT and a corresponding one of data input/output lines I/O <7:0>. The sense amplifier 181 includes NMOS transistors QN1811, QN1812, and QN1813, PMOS transistors QP1811 and QP1812, a capacitor C181, an operational amplifier OP181, and an inverter IV181.

When the PMOS transistor QP1811 is turned on, the voltage of a sense node NSEN connected to a non-inverting input terminal of the operational amplifier OP181 precharges the capacitor C181 while being raised. When the NMOS transistor QN1812 for clamping is turned on, the voltage of the sense node NSEN is discharged at a rate in accordance with a resistance value of a selected memory cell connected to the corresponding bit lines BL while being lowered. The operational amplifier OP181 compares the voltage of the sense node NSEN with a reference voltage VREF, and thereby determines whether the selected memory cell is in a set state or a reset state. Prior to a sensing operation, the NMOS transistor QN1811 discharges the sense node NSEN. Output from the operational amplifier OP181 is latched by the latch circuit 183 via the inverter IV181 activated by a read enable signal RE or REb.

Meanwhile, the write buffer 182 includes voltage applicator/detector circuits 182*a*, 182*b*, and 182*c*. The voltage applicator/detector circuits 182*a* to 182*c* apply pulsing voltages to the bit lines BL and detect currents flowing in the bit lines BL. The voltage applicator/detector circuits 182*a* to 182*c* stop application of the pulsing voltages to the bit lines BL based on the currents flowing therein. The voltage applicator/detector circuit 182*a* is driven at the time of the set operation. The voltage applicator/detector circuit 182*b* is driven at the time of the reset operation. The voltage applicator/detector circuit 182*c* is driven at the time of the forming operation.

Next, a description is given of the voltage applicator/detector circuit 182*a*.

Figure 16:
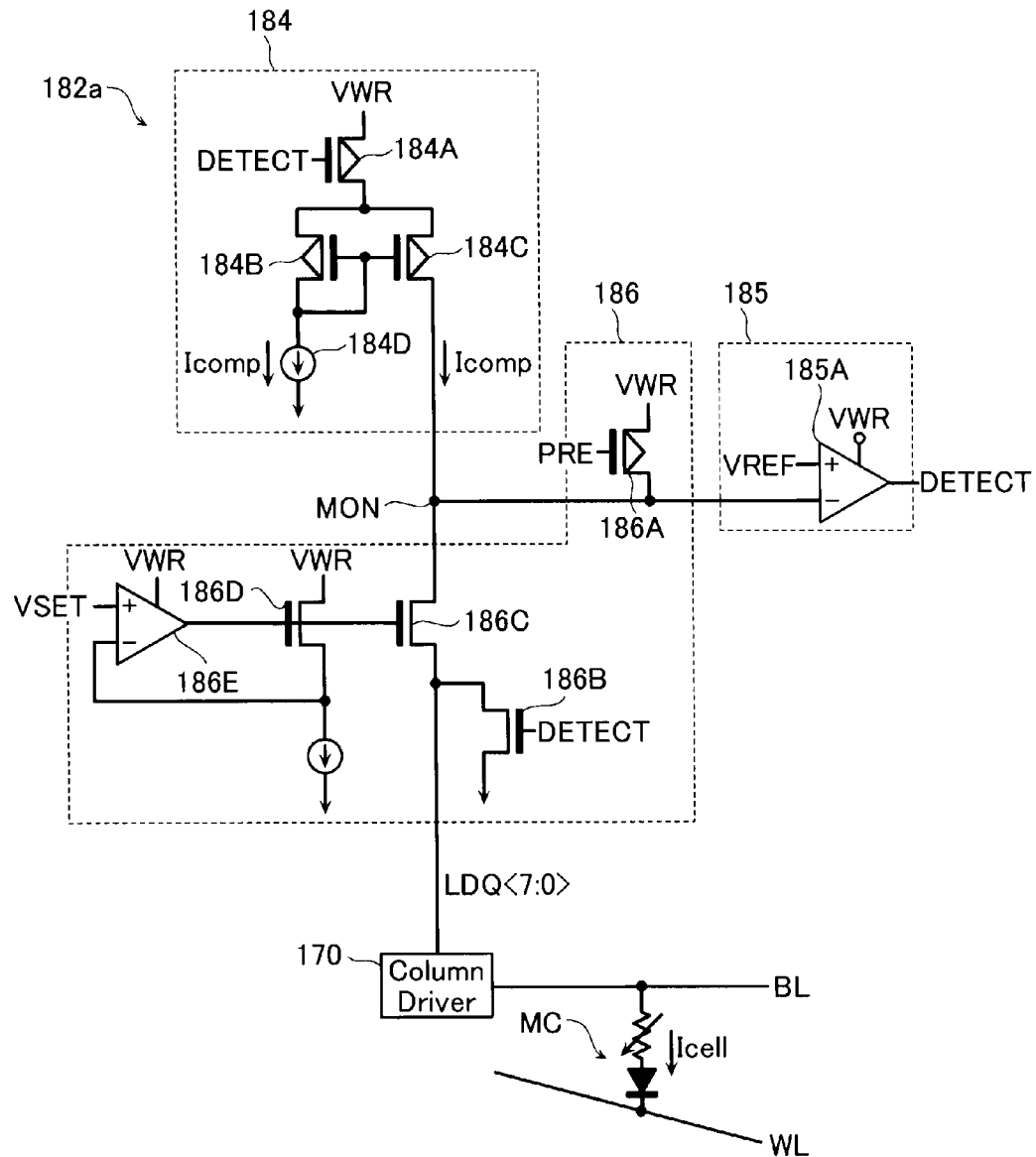
FIG. 16 is a circuit diagram of a voltage applicator/detector circuit 182a in the first embodiment.

FIG. 16 is a circuit diagram of the voltage applicator/detector circuit 182*a*. The voltage applicator/detector circuit 182*a* determines whether or not a current Icell flowing in a memory cell MC reaches a predetermined compliance current Icomp to control a voltage to be supplied to the corresponding bit line BL. The voltage applicator/detector circuit 182*a* includes a current supplier 184, a detector 185, and a voltage controller 186. The current supplier 184 supplies the compliance current Icomp to a monitoring node MON. The detector 185 detects that the cell current Icell exceeds the compliance current Icomp on the basis of the voltage of the monitoring node MON. The voltage controller 186 controls the voltage VSET to be applied to the bit lines BL on the basis of the detection result by the detector 185.

The current supplier 184 supplies the compliance current Icomp outputted from a power source 184D to the monitoring node MON via PMOS transistors 184B and 184C forming a current mirror pair. A PMOS transistor 184A is connected between the current mirror pair and a terminal for the voltage VWR. The PMOS transistor 184A shuts down a current supply path based on a detection signal DETECT from the detector 185.

The detector 185 is formed by an operational amplifier 185A configured to compare the voltage of the monitoring node MON with the reference voltage VREF and to output the detection signal DETECT when the voltage of the monitoring node MON is lower than the reference voltage VREF.

The voltage controller 186 is configured as follows. A PMOS transistor 186A configured to precharge the monitoring node MON is connected between the monitoring node MON and a terminal for supplying the voltage VWR. An NMOS transistor 186C connecting the monitoring node MON and the corresponding bit lines BL so as to apply the predetermined voltage VSET to the bit lines BL. The NMOS transistor 186C forms a current mirror pair together with an NMOS transistor 186D which is driven by an operational amplifier 186E. The operational amplifier 186E forms a source follower circuit in which the voltage VSET outputted from the regulator 50 is inputted to a non-inverting input terminal, a voltage of a source of the NMOS transistor 186D is inputted to an inverting input terminal, and a gate of the NMOS transistor 186D is controlled by the output from the operational amplifier 186E. Thereby, the voltage VSET is outputted to the sources of the NMOS transistors 186C and 186D. When the detection signal DETECT of the detector 185 becomes active, an NMOS transistor 186B becomes conductive and lowers the level of the bit lines BL to a level "L."

Next, a description is given of a specific configuration of each power circuit 200.

Figure 17:
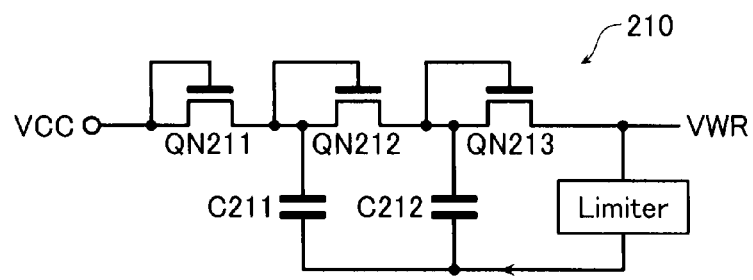
FIG. 17 is a circuit diagram of a selected-bit-line voltage generator (charge pump) 210 in the first embodiment.

FIG. 17 is a circuit diagram of the selected-bit-line voltage generator (charge pump) 210. The selected-bit-line voltage generator 210 includes three transistors QN211, QN212, and QN213 connected serially with each other between an input terminal (external supply voltage VCC) and an output terminal (selected-bit-line voltage VWR). The three transistors QN211 to QN213 each have a diode connection in which an input side is an anode and an output side is a cathode. The selected-bit-line voltage generator 210 includes capacitors C211 and C212 and a limiter. In each of the capacitors C211 and C212, one end thereof is connected to the drain side of transistors QN211, QN212, and QN213, and the other end is commonly connected.

The selected-bit-line voltage generator 210 accumulates charges supplied by the external supply voltage VCC in the capacitor C211, and further overlappingly accumulates these charges and charges supplied by the external supply voltage VCC in a capacitor C212. When the charges accumulated in the capacitor C212 are discharged, the selected-bit-line voltage VWR higher than the external supply voltage VCC can be obtained. Note that output from the selected-bit-line voltage generator 210 is limited by the limiter so as not to be equal to or higher than the selected-bit-line voltage VWR.

Next, a description is given of the non-selected-word-line voltage generator 220.

Figure 18:
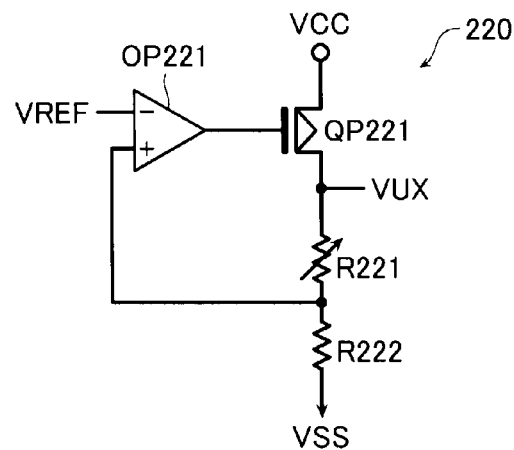
FIG. 18 is a circuit diagram of a non-selected-word-line voltage generator 220 in the first embodiment.

FIG. 18 is a circuit diagram of the non-selected-word-line voltage generator 220. The non-selected-word-line voltage generator 220 includes a PMOS transistor QP221, a variable resistor R221, and a fixed resistor R222 which are serially connected with each other between the external supply voltage VCC and a ground line. The non-selected-word-line voltage generator 220 further is includes an operational amplifier OP221 a non-inverting input terminal of which receives a voltage from a connection point between the resistors R221 and R222 and an inverting input terminal of which receives the predetermined reference voltage VREF for generating the non-selected-word-line voltage VUX. Output from the operational amplifier OP221 is inputted to a gate of the transistor QP221. A constant voltage circuit is formed in the non-selected-word-line voltage generator 220 by the components described above. The non-selected-word-line voltage VUX is generated at a connection point between the transistor QP221 and the resistor R221 in the circuit.

Next, a description is given of the non-selected-bit-line voltage generator 230.

Figure 19:
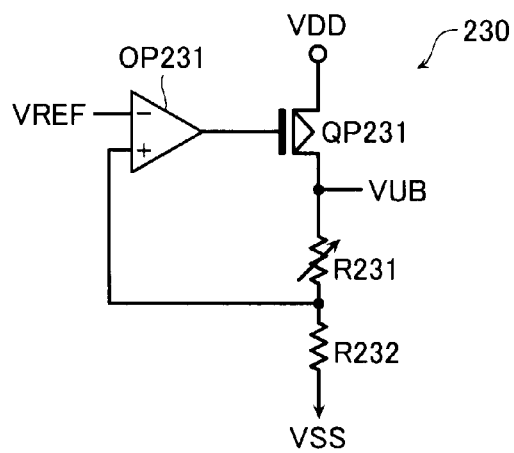
FIG. 19 is a circuit diagram of a non-selected-bit-line voltage generator 230 in the first embodiment.

FIG. 19 is a circuit diagram of the non-selected-bit-line voltage generator 230. The non-selected-bit-line voltage generator 230 includes a PMOS transistor QP231, a variable resistor R231, and a fixed resistor R232 which are serially connected with each other between the supply voltage VDD and a ground line. The non-selected-bit-line voltage generator 230 further includes an operational amplifier OP231 a non-inverting input terminal of which receives a voltage from a connection point between the resistors R231 and R232 and an inverting input terminal of which receives the predetermined reference voltage VREF for generating the non-selected-word-line voltage VUX. Output from the operational amplifier OP231 is inputted to a gate of the transistor QP231. A constant voltage circuit is formed in the non-selected-bit-line voltage generator 230 by the components described above. The non-selected-bit-line voltage VUB is generated at a connection point between the transistor QP231 and the resistor R231 in the circuit.

[Operations]

Figure 20:
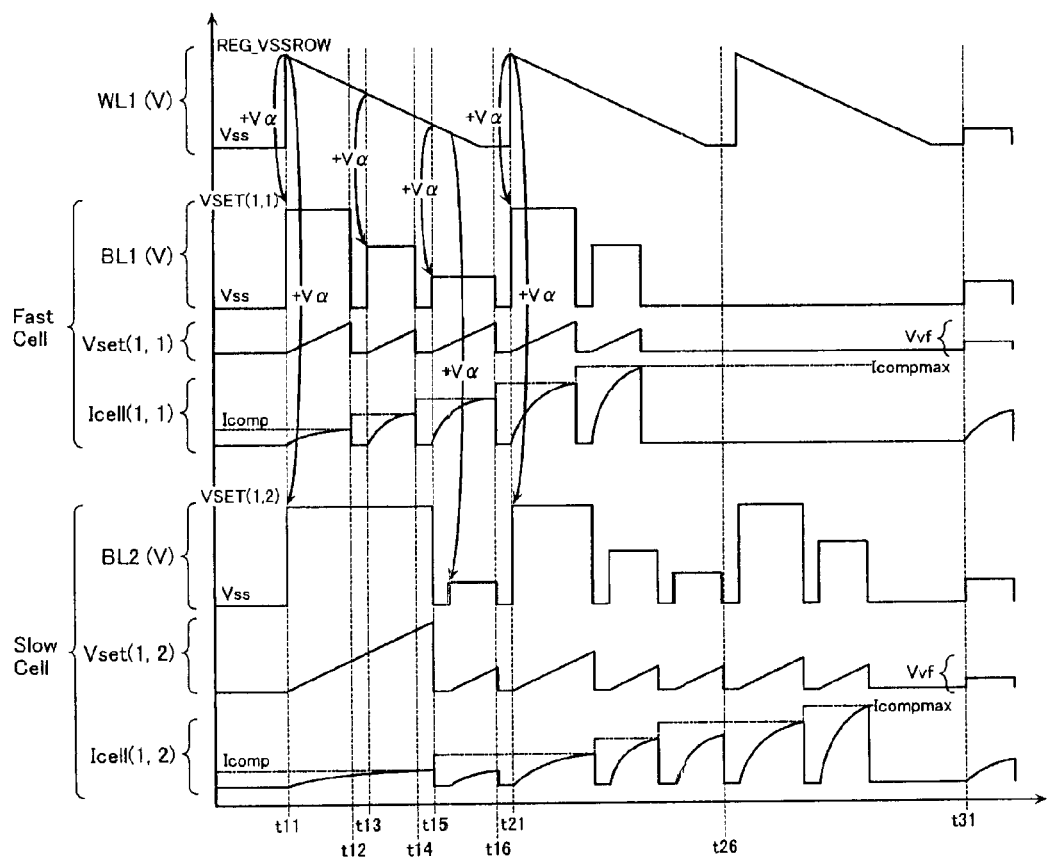
FIG. 20 is a waveform diagram showing the set operation of the semiconductor storage device according to the first embodiment.

Next, a description is given of set operations according to the first embodiment with reference to FIG. 20. In an example shown in FIG. 20, a word line WL1 is selected, and the set operations are performed on memory cells MC(1, 1) and MC(1, 2) which are commonly connected to the word line WL1. The voltage REG_VSSROW changing in a sloping manner in cycles is applied to the word line WL1. In contrast, voltages VSET(1, 1) and VSET(1, 2) which are independent from each other are applied to bit lines BL1 and BL2 in accordance with the characteristics of the memory cells MC(1, 1) and MC(1, 2), respectively. In FIG. 20, a current flowing from the bit line BL1 to the word line WL1 via the memory cell MC(1, 1) is denoted by a current Icell(1, 1), and a current flowing from the bit line BL2 to the word line WL1 via the memory cell MC(1, 2) is denoted by a current Icell(1, 2). In addition, in FIG. 20, voltages applied to variable resistive elements VR(1, 1) and VR(1, 2) of the memory cells MC(1, 1) and MC(1, 2) are denoted by voltages Vset(1, 1) and Vset(1, 2), respectively. The voltage Vset(1, 1) is equivalent to VSET(1, 1) −REG_VSSROW−Vf. Also in FIG. 20, concerning the rate at which a resistance value changes with an applied voltage, a rate in the memory cell MC(1, 1) is higher than that in the memory cell MC(1, 2). Note that the set operation shown in FIG. 20 is executed by the memory cell array core portion (control circuit) 100.

As shown in FIG. 20, the voltage REG_VSSROW of the word line WL1 and the voltages VSET(1, 1) and VSET(1, 2) of the bit lines BL1 and BL2 are raised to their maximum values at a time t11. Subsequently, the voltage REG_VSSROW is lowered gradually in a sloping manner. In contrast, the voltages VSET(1, 1) and VSET(1, 2) of the bit lines BL1 and BL2 keep the voltages applied at the time of rising edge. Thus, the voltages VSET(1, 1) and VSET(1, 2) applied to the variable resistive elements VR(1, 1) and VR(1, 2) are gradually raised, and the cell currents Icell(1, 1) and Icell(1, 2) applied to and flowing in the memory cells MC(1, 1) and MC(1, 2) are also gradually raised.

At a time t12, the cell current Icell(1, 1) flowing in the memory cell MC (1, 1) reaches the compliance current Icomp. Thus, the detector 185 detects reaching the compliance current Icomp, and the voltage of the bit line BL1 is lowered to a Vss level. The lowering of the voltage of the bit line BL1 to the Vss level once is intended to prevent a disturbance. Thereby, the voltage VSET(1, 1) applied to the variable resistive element VR(1, 1) is set at 0 V. However, since the cell current Icell(1, 2) flowing in the memory cell MC(1, 2) has not reached the compliance current Icomp, the voltage VSET(1, 2) is continued to be applied. Every time the cell current Icell(1, 1) reaches the compliance current Icomp, the compliance current Icomp is raised. The compliance current Icomp is raised by, for example, sequentially incrementing a compliance current initial value Icompini by a value ΔIcomp. Alternatively, the compliance current Icomp may be raised by multiplying the current value of the compliance current Icomp by a constant value.

In addition to a case (the time t12) where the detector 185 detects that the cell current Icell(1, 1) reaches the compliance current Icomp, in a case where (a time t16) the detector 185 detects that the voltage of the word line WL1 is lowered to a lower limit value (voltage Vss), the voltage VSET(1, 1) of the bit line BL1 is lowered to the voltage Vss. The voltage of the bit line BL1 is lowered to the voltage Vss, and then is raised so as to be the voltage Vα higher than the word line WL1 (times t13 and t21). Thereby, the voltage VSET(1, 1) is again raised gradually from zero. The reason why the voltage VSET (1, 1) is again raised from zero is that when the current Icell(1, 1) exceeds the compliance current Icomp, a resistance value exceeding a resistance value for the compliance current Icomp is unknown. If the applied voltage is not changed to the original one and continued to be given pulses of the same voltage, a resistance value thereof is changed drastically. As a result, a write error occurs in the memory cell MC, and the characteristic of the memory cell MC is changed. Note that the voltage of the bit line BL2 is independently controlled under the same condition as for the voltage of the bit line BL1 at times t11 to t16.

When determined as being lowered to the voltage Vss (the time t16), the voltage of the word line WL1 is again raised to the maximum value of the voltage REG_VSSROW at the time t21. Subsequently, the voltage is gradually lowered in the sloping manner until a time t26. Note that the voltages of the bit lines BL1 and BL2 are controlled in a period from the time t21 to t26 in the same manner as in a period from the time t11 to t16.

When both the compliance currents Icomp flowing in the bit lines BL1 and BL2 exceed an upper limit Icompmax (for example, Icompini+4×ΔIcomp), a series of set operations as shown from t11 to t26 described above is terminated (a time t31). Then, a verification operation is executed. In the verification operation, a verification voltage Vvf is applied to the variable resistive elements VR of the memory cells MC(1, 1) and MC(1, 2) and then the detector 185 detects whether or not the cell currents Icell(1, 1) and Icell(1, 2) flowing therein exceed a reference value.

[Effects]

A method in which a pulsing voltage applied to a bit line BL is raised every pulse application with a voltage VSSROW of a word line WL maintained constant does not guarantee that only one pulse causes a cell current Icell to reach a compliance current Icomp. In this respect, in the first embodiment, the voltage of the word line WL1 is lowered in the sloping manner while the voltage of the bit line BL1 is maintained constant, and thereby the set voltage Vset(1, 1) is gradually raised until the cell current Icell(1, 1) reaches the compliance current Icomp from the initial value thereof. Thereby, in the first embodiment, the pulse VSET applied to the bit line BL one time causes the cell current to reach the compliance current Icomp without fail, and the set operation can be speeded up.

In addition, in the first embodiment, the pulses VSET to the multiple bit lines BL can be generated within a cycle in which the voltage of the word line WL1 is lowered in the sloping manner, and thus speeding up due to this can be expected. Furthermore, the multiple memory cells MC connected to a single word line WL can be individually controlled, and thus the set or forming operation can be collectively performed on the multiple memory cells MC.

Second Embodiment

[Configuration]

Figure 21:
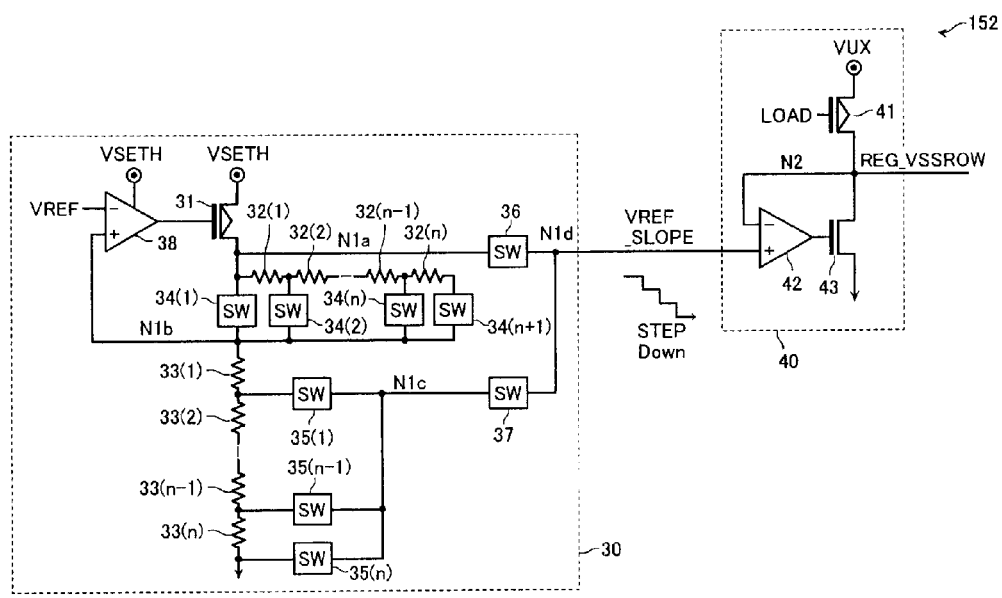
FIG. 21 is a circuit diagram of discharge circuits 152 in a second embodiment.

Next, a description is given of a semiconductor storage device according to a second embodiment. FIG. 21 is a circuit diagram of discharge circuits 152 according to the second embodiment. Note that in the second embodiment, the same components as those in the first embodiment are denoted by the same reference numerals, and a description thereof will be omitted.

A difference between the second embodiment and the first embodiment is a configuration of a voltage generator 30. In this embodiment, the voltage generator 30 outputs a voltage VREF_SLOPE which is lowered stepwise.

The voltage generator 30 includes a PMOS transistor 31, multiple resistors 32(l) to 32(n) and 33(l) to 33(n) which form a split resistor, multiple switches 34(l) to 34(n+1), 35(l) to 35(n), 36, and 37, and an operational amplifier (differential amplifier) 38.

A voltage VSETH is applied to a source of the PMOS transistor 31. A drain thereof is connected to one end (a node N1a) of the resistor 32(1).

The resistors 32(1) to 32(n) are serially connected with each other, and the resistors 33(1) to 33(n) are also serially connected with each other. The resistor 33(1) is connected commonly to one ends (a node N1b) of the switches 34(1) to 34(n), and the resistor 33(n) is grounded.

The other ends of the switches 34(1) to 34(n) are respectively connected to one ends of the resistors 32(1) to 32(n). The other end of the switch 34(n+1) is connected to the other end of the resistor 32(n). One ends of the switches 35(1) to 35(n) are connected to the other ends of the resistors 33(1) to 33(n). The other ends of the switches 35(1) to 35(n) are commonly connected to a node N1c.

One end of the switch 36 is connected to the node N1a, and the other end thereof is connected to a node N1d. One end of the switch 37 is commonly connected to the node N1c, and the other end thereof is connected to the node N1d. Note that the voltage VREF_SLOPE is supplied from the node N1d to the regulator 40.

An inverting input terminal of the operational amplifier 38 receives the reference voltage VREF, and a non-inverting input terminal thereof is connected to the node N1b. The operational amplifier 38 performs differential amplification on the two voltages and supplies a differential amplification signal thereof to a gate of the PMOS transistor 31.

According to the configuration described above, voltages of the nodes N1a and N1c are determined in accordance with a resistive partial voltage ratio determined by the switches 34(1) to 34(n+1) and 35(1) to 35(n). In such a manner that the level of the voltage of the node N1a or N1c is lowered stepwise, the switches 34(1) to 34(n+1) or 35(1) to 35(n) are controlled to be in a conductive/non-conductive state every predetermined clock. The switches 36 and 37 are controlled by switching therebetween, the voltages of the nodes N1a and N1c are supplied as the voltage VREF_SLOPE.

[Operations]

Figure 22:
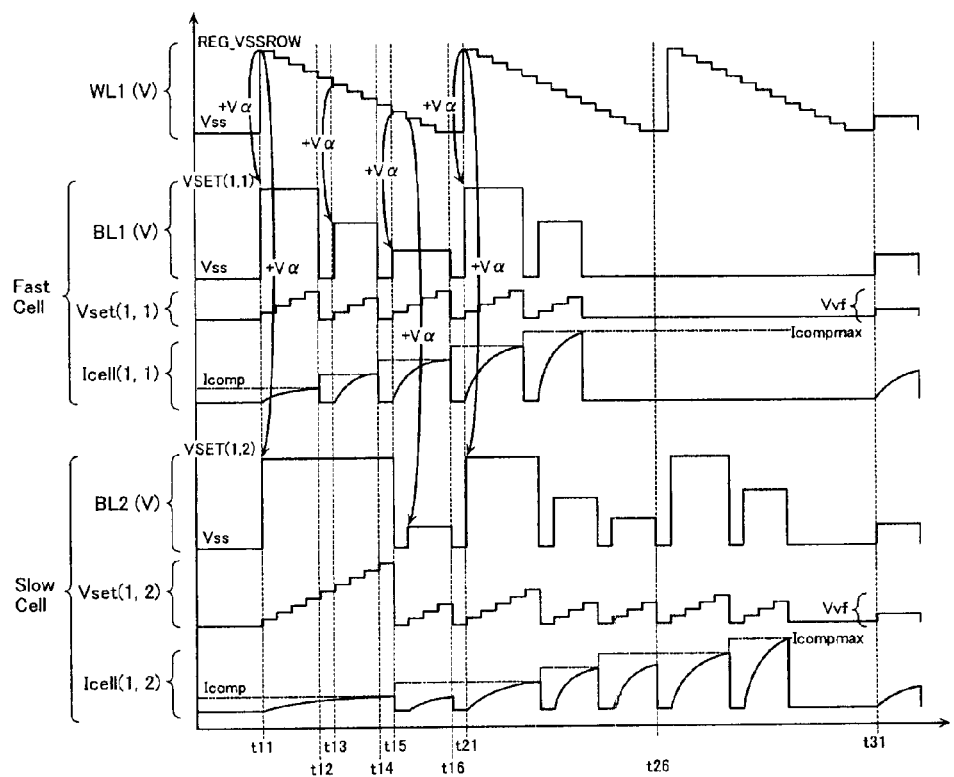
FIG. 22 is a waveform diagram showing a set operation of a semiconductor storage device according to the second embodiment.

Next, a description is given of set operations according to the second embodiment with reference to FIG. 22. In the second embodiment, as shown in FIG. 22, the voltage generator 30 described above changes the voltage of the word line WL1 in such a manner as to lower the voltage stepwise. Thereby, the set voltages Vset(1, 1) and Vset(1, 2) are raised stepwise. The other operations according to the second embodiment are the same as those in the first embodiment.

Other Embodiment

The embodiments of the semiconductor storage device have been described, but the present invention is not limited to the aforementioned embodiments. Various modifications, additions, replacements, and the like can be made without departing from the gist of the present invention. For example, although the examples in FIGS. 20 and 22 illustrate the set operations, the same operations as those in FIGS. 20 and 22 are executed also in forming operations.

In addition, in the first and second embodiments respectively shown in FIGS. 20 and 22, while the voltage gradually lowered from the maximum value of the voltage REG_VSS-ROW is applied to the word line WL1, the pulsing voltages are applied to the bit lines BL1 and BL2. Alternatively, the first and second embodiments may be ones in which a pulsing voltage is applied to the word line WL1, while voltages gradually raised from a predetermined voltage are applied to the bit lines BL1 and BL2.

What is claimed is:

1. A semiconductor storage device comprising:
    a memory cell array including a plurality of first lines, a plurality of second lines crossing the first lines, and memory cells arranged at intersections between the first lines and the second lines and each including a variable resistive element; and
    a control circuit which controls resistance values of the variable resistive elements in such a way that a cell voltage is applied to the memory cell arranged at an intersection between a selected one of the plurality of first lines and a selected one of the plurality of second lines by applying a first voltage to the selected first line and by applying a second voltage to the selected second line, wherein
    the control circuit applies a voltage gradually raised or lowered from a first initial voltage as the first voltage to the selected first line, and applies a pulsing voltage as the second voltage to the selected second line, and
    the second voltage includes a voltage pulse which is raised from a second initial voltage which the memory cell is a non-selected state to a raised voltage which the memory cell is a selected state, is kept at the raised voltage to thereby cause a cell current to flow into the memory cell, and is lowered to the second initial voltage when the cell current that increases while the voltage of the memory cell is rising with a change in the first voltage reaches a compliance current.

2. The semiconductor storage device according to claim 1, wherein the control circuit repeatedly generates the voltage pulse of the second voltage and raises the compliance current every time the cell current reaches the compliance current.

3. The semiconductor storage device according to claim 1, wherein
    the memory cell array is arranged in a matrix form on a semiconductor substrate, the control circuit includes a regulator circuit which generates the first voltage and which includes a final stage driver, and the final stage driver is arranged on the semiconductor substrate below the memory cell array.

4. The semiconductor storage device according to claim 2, wherein every time the first voltage reaches a third voltage, the control circuit repeats an operation in which the first voltage is returned to the first initial voltage and then is gradually raised or lowered, and the control circuit terminates a series of the operations when the compliance current exceeds an upper limit value.

5. The semiconductor storage device according to claim 1, wherein the control circuit applies a fourth voltage higher than the first voltage and lower than the second voltage to a non-selected one of the first lines, and the control circuit applies a fifth voltage higher than the first voltage and lower than the fourth voltage to a non-selected one of the second lines.

6. The semiconductor storage device according to claim 1, wherein the control circuit lowers the first voltage stepwise.

7. The semiconductor storage device according to claim 1, further comprising a voltage generator circuit, wherein the voltage generator circuit includes a plurality of resistors forming a split resistor, a plurality of switches, and an operational amplifier.

8. The semiconductor storage device according to claim 1, wherein the control circuit applies second voltages different depending on the second lines to the memory cells commonly connected to one of a plurality of the first lines.

9. A semiconductor storage device comprising:

a memory cell array including a plurality of first lines, a plurality of second lines crossing the first lines, and memory cells arranged at intersections between the first lines and the second lines and each including a variable resistive element; and a control circuit which controls resistance values of the variable resistive elements in such a way that a cell voltage is applied to the memory cells arranged at an intersection between a selected one of the first lines and a first-selected one of the second lines and at an intersection between the selected first line and a second-selected one of the second lines by applying a first voltage to the selected first line, by applying a second voltage to the first-selected second line, and by applying a third voltage to the second-selected second line, wherein the control circuit applies a voltage gradually raised or lowered from a first initial voltage as the first voltage to the selected first line, applies a pulsing voltage as the second voltage to the first-selected second line, and applies a pulsing voltage as the third voltage to the second-selected second line, and the second voltage includes a voltage pulse which is raised from a second initial voltage which the memory cell is a non-selected state of the memory cell to a voltage which the memory cell is a selected state, is kept at the raised voltage to thereby cause a cell current to flow into the memory cell, and is lowered to the second initial voltage when the cell current that increases while the voltage of the memory cell is rising along with a change in the first voltage reaches a compliance current, and the third voltage includes a voltage pulse which is raised from the second initial voltage which the memory cell is the non-selected state to the voltage which the memory cell is the selected state of the memory cell, is kept at the raised voltage to thereby cause a cell current to flow into the memory cell, and is lowered to the second initial voltage when the cell current that increases while the voltage of the memory cell is rising with the change in the first voltage reaches a compliance current.

10. The semiconductor storage device according to claim 9, wherein the control circuit repeatedly generates the voltage pulse of the second voltage and raises the compliance current every time each of the cell currents reaches the compliance current, and the control circuit repeatedly generates the voltage pulse of the third voltage and raises the compliance current every time the cell current reaches the compliance current.

11. The semiconductor storage device according to claim 9, wherein the memory cell array is arranged in a matrix form on a semiconductor substrate, the control circuit includes a regulator circuit which generates the first voltage and which includes a final stage driver, and the final stage driver is arranged on the semiconductor substrate below the memory cell array.

12. The semiconductor storage device according to claim 10, wherein every time the first voltage reaches a fourth voltage, the control circuit repeats an operation in which the first voltage is returned to the first initial voltage and then is gradually raised or lowered, and the control circuit terminates a series of the operations when the compliance current exceeds an upper limit value.

13. The semiconductor storage device according to claim 9, wherein the control circuit applies a fourth voltage higher than the first voltage and lower than the second voltage to a non-selected one of the first lines, and the control circuit applies a fifth voltage higher than the first voltage and lower than the fourth voltage to a non-selected one of the second lines.

14. The semiconductor storage device according to claim 9, wherein the control circuit lowers the first voltage stepwise.

15. The semiconductor storage device according to claim 9, further comprising a voltage generator circuit, wherein the voltage generator circuit includes a plurality of resistors forming a split resistor, a plurality of switches, and an operational amplifier.

* * * * *

UNITED STATES PATENT AND TRADEMARK OFFICE
CERTIFICATE OF CORRECTION

PATENT NO. : 8,625,329 B2
APPLICATION NO. : 13/187891
DATED : January 7, 2014
INVENTOR(S) : Hiroshi Maejima It is certified that error appears in the above-identified patent and that said Letters Patent is hereby corrected as shown below:

On the title page, Item (73), the Assignee's Information is incorrect. Item (73) should read:

--(73)   Assignee:      Kabushiki Kaisha Toshiba,     Tokyo (JP)--

Signed and Sealed this
Eighth Day of April, 2014

Michelle K. Lee
*Deputy Director of the United States Patent and Trademark Office*